(12) United States Patent
Shim

(10) Patent No.: US 7,595,216 B2
(45) Date of Patent: Sep. 29, 2009

(54) METHOD FOR MANUFACTURING CMOS IMAGE SENSOR

(75) Inventor: Hee Sung Shim, Gangneung-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 475 days.

(21) Appl. No.: 11/612,598

(22) Filed: Dec. 19, 2006

(65) Prior Publication Data

US 2007/0155044 A1    Jul. 5, 2007

(30) Foreign Application Priority Data

Dec. 29, 2005  (KR) ............... 10-2005-0134453

(51) Int. Cl.
*H01L 21/00* (2006.01)
(52) U.S. Cl. .................... 438/70; 257/E21.536
(58) Field of Classification Search ............ 438/70, 438/71; 257/E21.536
See application file for complete search history.

(56) References Cited

U.S. PATENT DOCUMENTS 5,605,783 A * 2/1997 Revelli et al. ............... 430/321
6,531,266 B1 * 3/2003 Chang et al. ................ 430/321

* cited by examiner

*Primary Examiner*—Chandra Chaudhari
(74) *Attorney, Agent, or Firm*—Saliwanshik, Lloyd & Saliwanchik

(57) ABSTRACT

A method for manufacturing CMOS image sensor is provided. The method includes: forming an interlayer dielectric on a semiconductor substrate on which a plurality of photodiodes are formed; forming a plurality of color filters at regular intervals on the interlayer dielectric; forming a planarization layer on an entire surface of the semiconductor substrate including the color filters; forming sacrificial resist patterns on the planarization layer, the sacrificial resist patterns being spaced apart from each other; forming spacers at sidewalls of the sacrificial resist patterns; removing the sacrificial resist patterns; forming a resist layer on the planarization layer on which only the spacers remain; removing the spacers; and reflowing the resist layer at a predetermined temperature to form a microlens.

10 Claims, 3 Drawing Sheets

METHOD FOR MANUFACTURING CMOS IMAGE SENSOR

RELATED APPLICATION(S)

This application claims the benefit under 35 USC §119(e) of Korean Patent Application No. 10-2005-0134453 filed Dec. 29, 2005, which is incorporated herein by reference in its entirety.

FIELD OF THE INVENTION

The present invention relates to a method for manufacturing an image sensor, and more particularly, to a method for manufacturing a complementary metal oxide silicon (CMOS) image sensor.

BACKGROUND OF THE INVENTION

In general, an image sensor is a semiconductor device that transforms an optical image to electrical signals. The image sensor is generally classified as a charge coupled device (CCD) or a CMOS image sensor.

The CCD includes a matrix of photodiodes (PD). Each photodiode converts an optical signal into an electric signal. The CCD also includes a plurality of vertical charge coupled devices (VCCDs). The VCCDs are formed between vertical lines of the photodiodes in the matrix for transmission of charges generated at the photodiodes in a vertical direction. The CCD further includes horizontal charge coupled devices (HCCDs) for transmission of the charges transmitted through the VCCDs in a horizontal direction. In addition, the CCD includes a sense amplifier for sensing the charges transmitted in the horizontal direction and outputting an electric signal.

However, the CCD is disadvantageous in that it has a complicated driving method, exhibits high power consumption, and is produced via a complicated fabrication process involving multiple photo process stages.

Moreover, the CCD has another disadvantage in that it is difficult to include a CCD in a small product due to the difficulty in integrating a control circuit, a signal processing circuit, and an A/D converter, and the like on a CCD chip.

Recently, the CMOS sensor has been heralded as the next generation image sensor that can overcome the disadvantages of CCDs.

The CMOS image sensor is a device that employs CMOS technology to capture an image. Specifically, a control circuit, a signal processing circuit, and the like are used as peripheral circuits for successively detecting outputs from pixels using MOS transistors. A MOS transistor is formed on the semiconductor substrate for each pixel.

That is, the CMOS image sensor has a photodiode and a MOS transistor formed within each unit pixel. By monitoring the switching of the MOS transistors, the CMOS image sensor successively detects electric signals from the photodiodes of the unit pixels to reproduce an image.

The CMOS image sensor exhibits low power consumption and has a simple fabrication process as a result of fewer photo process stages.

The following is a description of a method for fabricating a CMOS image sensor according to the related art with reference to the accompanying drawings.

FIGS. 1A and 1B are cross-sectional views of a CMOS image sensor for describing a method of fabricating a CMOS image sensor according to the related art.

Referring to FIG. 1A, an interlayer dielectric 12 is formed on a semiconductor substrate (not shown). Here, the substrate includes a plurality of photo sensing devices, for example, photodiodes 11.

The interlayer dielectric 12 may be formed with multi layers. Although not shown, after one interlayer dielectric layer has been formed, a light shielding layer may be formed and another interlayer dielectric layer can then be formed thereon. Here, the light shielding layer functions to block light incident on parts of the substrate other than photodiode regions.

Next, a planarized passivation layer 13 is formed on the interlayer dielectric 12 in order to protect a device from moisture and to prevent the device from being scratched.

Then, color filters 14, which filter light by wavelengths, are formed by coating the passivation layer 13 with a dyable resist, and then performing exposure and developing processes.

Here, a photolithography process is selectively performed in the red (R), green (G), and blue (B) color filter layers 14 three times to form a color separating layer.

Next, a planarization layer 15 is formed on the color filter layers 14 in order to adjust a focusing distance and secure the flatness for forming a lens layer.

Further, a thermal treatment is performed at a temperature greater than 200° C. so as to cure the planarization layer 15.

Then, a resist layer for a microlens is coated on the planarization layer 35, and a reticle (not shown) having an opening portion is aligned above the resist layer. Next, light such as a laser beam is irradiated to an entire surface of the semiconductor substrate using the reticle as a mask to selectively expose the resist layer through the openings of the reticle.

Then, the exposed resist layer 16a is developed to form a microlens pattern 20.

Thereafter, as shown in FIG. 2B, the microlens patterns 20 are reflown at a predetermined temperature to form microlenses 22.

However, during the forming process of the microlens pattern 20 it is difficult to precisely define intervals between microlens patterns because of the limit of the resolution of photolithographic equipment. Moreover, after completion of the reflow process, adjacent microlenses will not have a zero-gap.

Consequently, some light may not be focused to a light receiving section of the CMOS image sensor, which results in the deterioration in the sensitivity of the CMOS image sensor.

BRIEF SUMMARY

Accordingly, embodiments of the present invention are directed to a method for manufacturing a CMOS image sensor that substantially obviates one or more problems due to limitations and disadvantages of the related art.

An object of embodiments of the present invention is to provide a method for manufacturing a CMOS image sensor, which improves sensitivity by maintaining a zero-gap between microlenses.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of manufacturing a CMOS (complementary metal oxide silicon) image sensor comprising: forming an interlayer dielectric on a semiconductor substrate on which a plurality of photodiodes are formed; forming a plurality of color filters at regular intervals on the interlayer dielectric; forming a planarization layer on an entire surface of the semiconductor substrate including the color filters; forming sacrificial resist patterns on the planarization layer that are spaced apart from each other; forming spacers at sidewalls of the sacrificial resist patterns; removing the sacrificial resist patterns while remaining the spacers; forming a resist layer on the planarization layer on which the spacers remain; removing the spacers; and reflowing the resist layer at a predetermined temperature to form a microlens.

In a specific embodiment, the spacers can be formed by depositing and dry-etching a plasma enhanced-tetraethoxysilane (PE-TEOS) system liner oxide layer on the sacrificial resist pattern.

The sacrificial resist patterns can be formed by coating and patterning the resist layer by exposure and developing processes.

In embodiments, the reflowing of the resist layer can be performed at a temperature ranging from 300 to 700° C.

The method can further comprise recessing a part of the resist layer within the spacers by a dry etching process in order to form the resist layer of a uniform thickness between the spacers.

In another aspect of the present invention, there is provided a method of manufacturing a CMOS (complementary metal oxide silicon) image sensor comprising: providing a semiconductor substrate on which a planarization layer is formed for forming a microlens; forming sacrificial resist patterns on the planarization layer that are spaced apart from each other; forming spacers at sidewalls of the sacrificial resist patterns; removing the sacrificial resist patterns; forming a resist layer on the planarization layer on which only the spacers remain; removing the spacers; and reflowing the resist layer at a predetermined temperature to form a microlens.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for manufacturing a CMOS image sensor according to embodiments of the present invention will be explained in detail referring to the accompanying drawings.

FIGS. 2A through 2F are cross-sectional views of a CMOS image sensor for describing a method of manufacturing a CMOS image sensor according to an embodiment of the present invention.

Figure 1A:
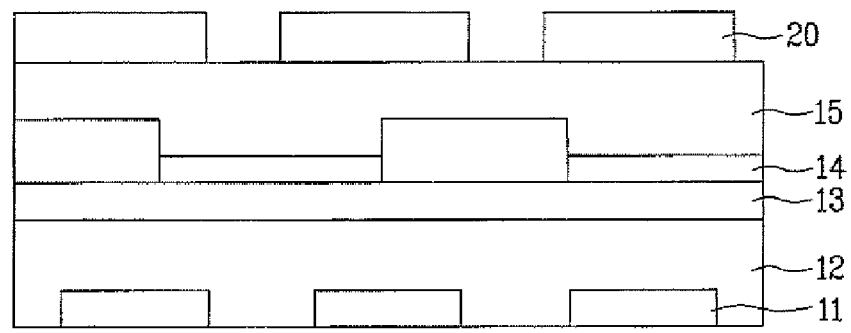
FIGS. 1A and 1B are cross-sectional views of a CMOS image sensor for describing a method of fabricating a CMOS image sensor according to the related art.
Figure 1B:
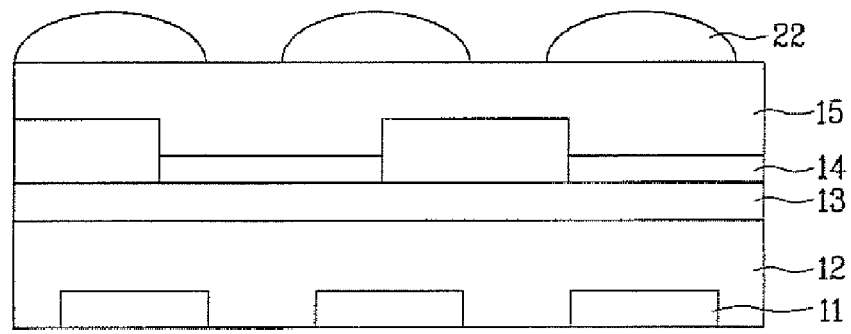
Figure 2A:
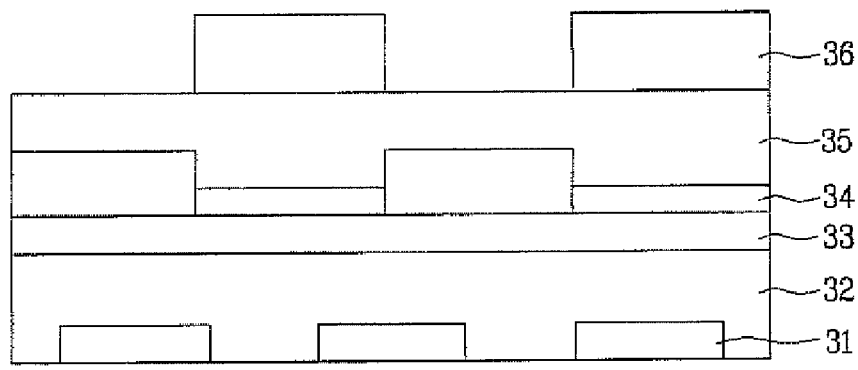
FIGS. 2A through 2F are cross-sectional views of a CMOS image sensor for describing a method of manufacturing a CMOS image sensor according to an embodiment of the present invention.

Referring to FIG. 2A, an interlayer dielectric 32 can be formed on an entire surface of a semiconductor substrate (not shown). The semiconductor substrate can have at least one photodiode 31 formed thereon for producing charges according to an amount of incident light.

In one embodiment, the interlayer dielectric 32 may be formed with multi layers. Although not shown, after one interlayer dielectric layer has been formed, a light shielding layer may be formed and then another interlayer dielectric layer can be formed thereon. Here, the light shielding layer functions to block light incident on parts other than regions having photodiodes 31.

Next, a planarized passivation layer 33 can be formed on the interlayer dielectric 32 in order to protect a device from moisture and to prevent the device from being scratched.

The passivation layer 33 can be coated with a dyable resist and patterned to form red (R), green (G), and blue (B) color filter layers 34, which filter light by wavelengths.

In an embodiment, a photolithography process can be selectively performed in the red (R), green (G), and blue (B) color filter layers 34 three times to form a color separating layer.

Then, an UV exposure process can be carried out in the respective color filter layers 34 to reform any unstable state of surfaces thereof.

Next, a planarization layer 35 can be formed on the color filter layers 34 in order to adjust a focusing distance and secure the flatness for forming a lens layer.

In one embodiment, a thermal treatment can be performed at a temperature ranging from 150 to 300° C. so as to cure the planarization layer 35.

Then, a first resist layer can be coated on the planarization layer 35, and a reticle (not shown) having an opening portion can be aligned above the first resist layer. Next, light such as a laser beam can be irradiated to an entire surface of the semiconductor substrate using the reticle as a mask to selectively expose the first resist layer through the openings of the reticle. The exposed resist layer can be developed to form a sacrificial resist pattern 36.

Figure 2B:
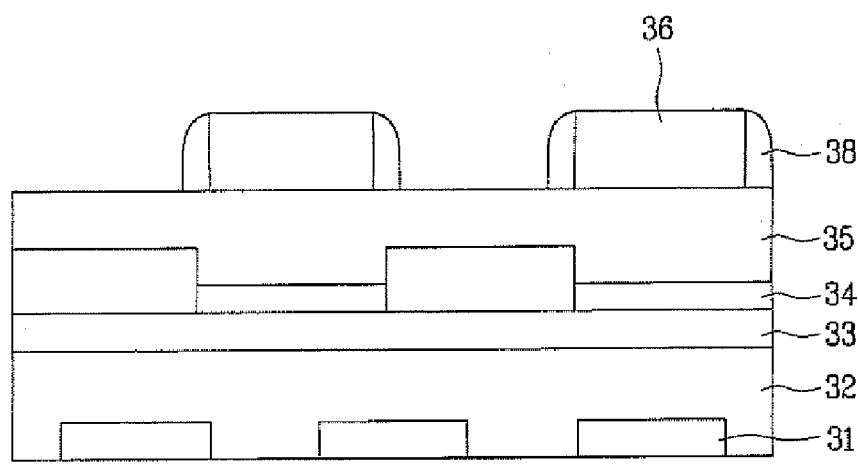

Subsequently, as shown in FIG. 2B, a plasma enhanced-tetraethoxysilane (PE-TEOS) system liner oxide layer can be deposited on the resulting structure and a dry etching can be performed on the liner oxide layer to form a spacer 38 at sidewalls of the sacrificial resist pattern 36.

Figure 2C:
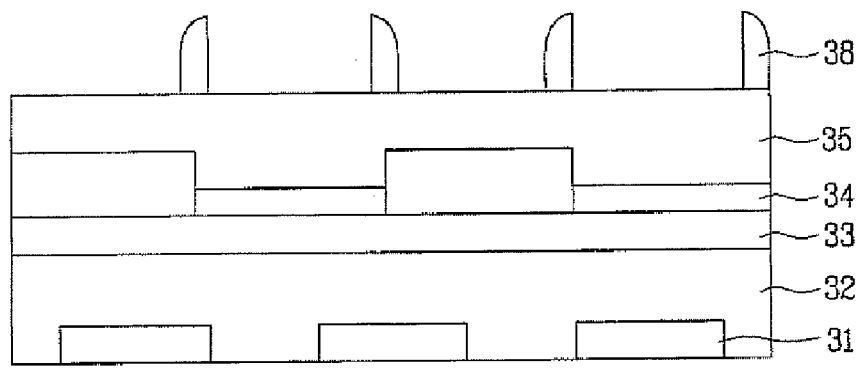

Next, as shown in FIG. 2C, the sacrificial resist pattern 36 can be removed by a strip process while leaving the spacers 38 to remain on the planarization layer 35.

Figure 2D:
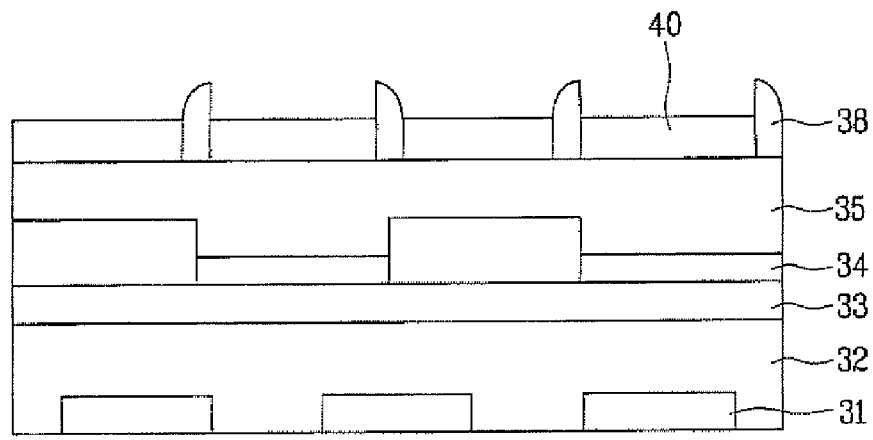

Subsequently, as shown in FIG. 2D, a second resist layer 40 can be coated on the planarization layer 35 on which the spacers 38 are formed.

A microlens pattern can be defined by the second deposited resist layer 40 through the spacers 38.

In a further embodiment, when it is difficult to form the second resist layer of a uniform thickness between the spacers, after the deposition of the second resist layer, a dry etching process can be performed on the entire surface of the wafer to recess a non-uniform region of the second resist layer between the spacers 38.

Figure 2E:

Next, as shown in FIG. 2E, a wet etching process can be performed on the entire surface of the resulting structure to remove the spacers 38. Accordingly, the second resist layers, which have uniform spacing due to the spacers 38, remain, thereby forming the microlens patterns 40.

Figure 2F:
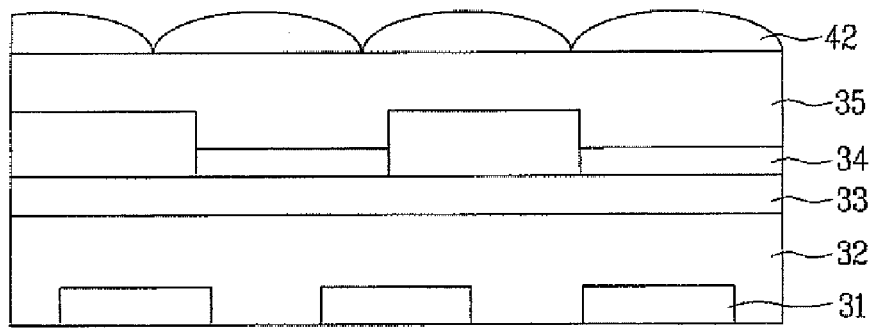

Referring to FIG. 2F, the microlens patterns 40 can be reflown at a predetermined temperature to form a plurality of microlenses 42.

In one embodiment, the reflow temperature ranges from approximately 300 to 700° C. in order to form the microlenses 42.

Accordingly, because the microlens patterns have regular intervals due to the spacers, a zero-gap may be also maintained between adjacent microlenses after the completion of the reflow process. This allows light to be focused to a light receiving section without losing light that travels without passing through a microlens. Therefore, the sensitivity of the CMOS image sensor can be improved.

In accordance with embodiments of the present invention, since the microlens patterns have regular intervals due to removal of the spacers, a zero-gap may be also maintained between adjacent microlenses after a completion of the reflow process. This allows light to be focused to a light receiving section without the loss of light traveling straight without passing through the microlens, with the result that the sensitivity of the CMOS image sensor can be improved.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method of manufacturing a CMOS (complementary metal oxide silicon) image sensor comprising:
    forming an interlayer dielectric on a semiconductor substrate having a plurality of photodiodes formed thereon;
    forming a plurality of color filters at regular intervals on the interlayer dielectric;
    forming a planarization layer on an entire surface of the semiconductor substrate including the color filters;
    forming sacrificial resist patterns on the planarization layer, wherein the sacrificial resist patterns are spaced apart from each other;
    forming spacers at sidewalls of the sacrificial resist patterns;
    removing the sacrificial resist patterns while leaving the spacers to remain;
    forming a resist layer on the planarization layer on which the spacers remain;
    removing the spacers; and
    reflowing the resist layer at a predetermined temperature to form a microlens.

2. The method according to claim 1, wherein forming the sacrificial resist patterns comprises:
    coating a first resist layer on the semiconductor substrate, and
    patterning the first resist layer by exposure and developing processes.

3. The method according to claim 1, wherein forming spacers at sidewalls of the sacrificial resist patterns comprises:
    depositing a plasma enhanced-tetraethoxysilane (PE-TEOS) system liner oxide layer on the sacrificial resist pattern, and
    dry etching the liner oxide layer.

4. The method according to claim 1, further comprising recessing a part of the resist layer formed on the planarization layer on which the spacers remain in order to provide a uniform thickness for the resist layer by performing a dry etching process.

5. The method according to claim 1, wherein the reflowing the resist layer is performed at a temperature ranging from 300 to 700° C.

6. A method of manufacturing a CMOS (complementary metal oxide silicon) image sensor comprising:
    providing a semiconductor substrate on which a planarization layer is formed for forming a microlens;
    forming sacrificial resist patterns spaced apart from each other on the planarization layer;
    forming spacers at sidewalls of the sacrificial resist patterns;
    removing the sacrificial resist patterns, while leaving the spacers to remain;
    forming a resist layer on the planarization layer on which the spacers remain;
    removing the spacers; and
    reflowing the resist layer at a predetermined temperature to form a microlens.

7. The method according to claim 6, wherein forming the sacrificial resist patterns comprises:
    coating a first resist layer on the semiconductor substrate, and
    patterning the first resist layer by exposure and developing processes.

8. The method according to claim 6, wherein forming spacers at sidewalls of the sacrificial resist patterns comprises:
    depositing a plasma enhanced-tetraethoxysilane (PE-TEOS) system liner oxide layer on the sacrificial resist pattern, and
    dry etching the liner oxide layer.

9. The method according to claim 6, further comprising recessing a part of the resist layer formed on the planarization layer on which the spacers remain in order to provide a uniform thickness for the resist layer by performing a dry etching process.

10. The method according to claim 6, wherein the reflowing the resist layer is performed at a temperature ranging from 300 to 700° C.

* * * * *